United States Patent
Leung et al.

(10) Patent No.: US 11,915,932 B2
(45) Date of Patent: Feb. 27, 2024

(54) PLASMA ETCHING OF MASK MATERIALS

(71) Applicant: Applied Materials, Inc., Santa Clara, CA (US)

(72) Inventors: Toi Yue Becky Leung, San Jose, CA (US); Madhavi Rajaram Chandrachood, Sunnyvale, CA (US); Madhava Rao Yalamanchili, Morgan Hill, CA (US)

(73) Assignee: Applied Materials, Inc., Santa Clara, CA (US)

( * ) Notice: Subject to any disclaimer, the term of this patent is extended or adjusted under 35 U.S.C. 154(b) by 289 days.

(21) Appl. No.: 17/242,758

(22) Filed: Apr. 28, 2021

(65) Prior Publication Data
US 2022/0351972 A1    Nov. 3, 2022

(51) Int. Cl.
*H01L 21/033*    (2006.01)

(52) U.S. Cl.
CPC ...... *H01L 21/0338* (2013.01); *H01L 21/0332* (2013.01); *H01L 21/0335* (2013.01); *H01L 21/0337* (2013.01)

(58) Field of Classification Search
CPC ............. H01L 21/3332; H01L 21/3335; H01L 21/3337; H01L 21/3338
USPC .............................................. 438/714; 216/67
See application file for complete search history.

(56) References Cited

U.S. PATENT DOCUMENTS

| | | | |
|---|---|---|---|
| 6,277,762 B1 * | 8/2001 | Hwang | H01L 21/00 438/714 |
| 6,296,780 B1 * | 10/2001 | Yan et al. | H01L 21/3213 216/67 |
| 6,489,245 B1 | 12/2002 | Winniczek et al. | |
| 9,740,091 B2 * | 8/2017 | Onoue et al. | G03F 1/24 |
| 2003/0123605 A1 * | 7/2003 | Rau | G21K 5/00 378/34 |
| 2006/0154151 A1 | 7/2006 | Anderson et al. | |
| 2006/0166107 A1 | 7/2006 | Chen et al. | |
| 2008/0070128 A1 * | 3/2008 | Wu et al. | G03F 1/00 430/5 |
| 2008/0179282 A1 | 7/2008 | Chandrachood et al. | |
| 2013/0048606 A1 | 2/2013 | Mao et al. | |
| 2014/0154615 A1 * | 6/2014 | Yu et al. | G03F 1/00 430/5 |

OTHER PUBLICATIONS

Application No. PCT/US2022/023782, International Search Report and Written Opinion, dated Jul. 28, 2022, 9 pages.

* cited by examiner

*Primary Examiner* — Changhyun Yi
(74) *Attorney, Agent, or Firm* — Kilpatrick Townsend & Stockton LLP

(57) ABSTRACT

Exemplary etching methods may include forming a plasma of a fluorine-containing precursor to produce plasma effluents. A first bias frequency may be applied while forming the plasma. The methods may include contacting a substrate housed in a processing region of a semiconductor processing chamber with the plasma effluents. The substrate may be or include a photomask. The methods may include etching a first layer of the photomask. Etching the first layer of the photomask may expose a second layer of the photomask. The methods may include adjusting the first bias frequency to a second bias frequency while maintaining the plasma of the fluorine-containing precursor. The methods may include etching the second layer of the photomask.

20 Claims, 5 Drawing Sheets

PLASMA ETCHING OF MASK MATERIALS

TECHNICAL FIELD

The present technology relates to semiconductor processes and equipment. More specifically, the present technology relates to selectively etching mask structures.

BACKGROUND

Integrated circuits are made possible by processes which produce intricately patterned material layers on substrate surfaces. Producing patterned material on a substrate requires controlled methods for removal of exposed material. Chemical etching is used for a variety of purposes including transferring a pattern in photoresist into underlying layers, thinning layers, or thinning lateral dimensions of features already present on the surface. Often it is desirable to have an etch process that etches one material faster than another facilitating, for example, a pattern transfer process. Such an etch process is said to be selective to the first material. As a result of the diversity of materials, circuits, and processes, etch processes have been developed with a selectivity towards a variety of materials.

Etch processes may be termed wet or dry based on the materials used in the process. For example, a wet etch may preferentially remove some oxide dielectrics over other dielectrics and materials. However, wet processes may have difficulty penetrating some constrained trenches and also may sometimes deform the remaining material. Dry etches produced in local plasmas formed within the substrate processing region can penetrate more constrained trenches and exhibit less deformation of delicate remaining structures. However, local plasmas may damage the substrate through the production of electric arcs as they discharge.

Thus, there is a need for improved systems and methods that can be used to produce high quality devices and structures. These and other needs are addressed by the present technology.

SUMMARY

Exemplary etching methods may include forming a plasma of a fluorine-containing precursor to produce plasma effluents. A first bias frequency may be applied while forming the plasma. The methods may include contacting a substrate housed in a processing region of a semiconductor processing chamber with the plasma effluents. The substrate may be or include a photomask. The methods may include etching a first layer of the photomask. Etching the first layer of the photomask may expose a second layer of the photomask. The methods may include adjusting the first bias frequency to a second bias frequency while maintaining the plasma of the fluorine-containing precursor. The methods may include etching the second layer of the photomask.

In some embodiments, the photomask may include a mirror layer, an absorber overlying a mirror layer, and a capping layer disposed between the absorber and the mirror layer. The capping layer may include a metal. The photomask may include a hardmask overlying the absorber. The photomask may include an anti-reflective coating layer disposed between the hardmask and the absorber. At least one of the hardmask and the anti-reflective coating layer may be or include an oxide or a nitride material. The photomask may include a layer of material disposed between the hardmask and the anti-reflective coating layer. The layer of material may be or include a metal. The fluorine-containing precursor may include a first fluorine-containing precursor. The fluorine-containing precursor may include a second halogen-containing precursor. The first fluorine-containing precursor may include carbon, and the second halogen-containing precursor may be free of carbon. A flow rate ratio of the first fluorine-containing precursor to the second halogen-containing precursor may be greater than or about 2:1. The methods may include, subsequent etching the first layer of the photomask, adjusting a flow rate ratio of the first fluorine-containing precursor and the second halogen-containing precursor. The fluorine-containing precursor may include a third precursor. The third precursor may include carbon. The third precursor may be utilized during only one of etching the first layer of the photomask or etching the second layer of the photomask. A chamber pressure within the semiconductor processing chamber may be maintained at less than or about 50 mTorr. Etching the second layer of the photomask may expose a third layer of the photomask. The methods may include adjusting the second bias frequency to a third bias frequency while maintaining the plasma of the fluorine-containing precursor. A power or effective power applied may be less than or about 500 W, and may be provided as continuous wave, source pulsing, bias pulsing, or both of the source and bias pulsing.

Some embodiments of the present technology may encompass etching methods. The methods may include forming a plasma of a first fluorine-containing precursor and a second halogen-containing precursor to produce plasma effluents. A first bias frequency may be applied while forming the plasma. The methods may include contacting a substrate housed in a processing region of a semiconductor processing chamber with the plasma effluents. The substrate may be or include a photomask. The photomask may include at least three layers between a hardmask and a mirror layer of the photomask. The methods may include etching a first layer of the photomask. Etching the first layer of the photomask may expose a second layer of the photomask. The methods may include adjusting at least one of: the first bias frequency to a second bias frequency, a pressure within the semiconductor processing chamber, an effective power of either a source or bias electrode or both electrodes, or a flow rate ratio between the first fluorine-containing precursor and the second halogen-containing precursor. The methods may include etching the second layer of the photomask.

In some embodiments, the methods may include detecting exposure of the second layer of the photomask while etching the first layer of the photomask. The photomask may include a mirror layer, an absorber overlying a mirror layer, and a capping layer disposed between the absorber and the mirror layer. The capping layer may be or include a metal. The absorber may be or include at least two layers of material. Etching the second layer of the photomask may expose a third layer of the photomask. The methods may include etching the third layer of the photomask. A bias frequency may be maintained between either etching the first layer of the photomask and the second layer of the photomask, or etching the second layer of the photomask and etching the third layer of the photomask. At least one of the three layers may include a first transition metal. The hardmask may include a second metal characterized by a hardness or etch resistance less than a hardness or etch resistance of the first transition metal. The plasma may be further formed of a third precursor. The first fluorine-containing precursor may include carbon, the second halogen-containing precursor may be free of carbon, and the third precursor may include carbon.

Some embodiments of the present technology may encompass etching methods. The methods may include forming a plasma of at least one fluorine-containing precursor to produce plasma effluents. A first bias frequency may be applied while forming the plasma. The methods may include contacting a substrate housed in a processing region of a semiconductor processing chamber with the plasma effluents. The substrate may be or include a photomask, and the photomask may include at least two layers between a hardmask and a mirror layer of the photomask. The methods may include etching a first layer of the photomask. Etching the first layer of the photomask may expose a second layer of the photomask. The methods may include adjusting the first bias frequency to a second bias frequency. The first bias frequency may be greater than or about 10 MHz, and the second bias frequency may be less than or about 10 MHz. Either or both bias frequencies may also be a combination of multiple frequencies. The methods may include etching the second layer of the photomask. In some embodiments, the photomask may include a mirror layer, an absorber overlying a mirror layer, and a metal-containing capping layer disposed between the absorber and the mirror layer.

Such technology may provide numerous benefits over conventional systems and techniques. For example, the processes may allow a precisely controlled dry etch to be performed, which may protect a variety of materials on the substrate. Additionally, the processes may be selectively adjusted in situ to etch subsequent materials in a stack to produce features extending through multiple layers of a structure. These and other embodiments, along with many of their advantages and features, are described in more detail in conjunction with the below description and attached figures.

BRIEF DESCRIPTION OF THE DRAWINGS

A further understanding of the nature and advantages of the disclosed technology may be realized by reference to the remaining portions of the specification and the drawings.

Figure 1:
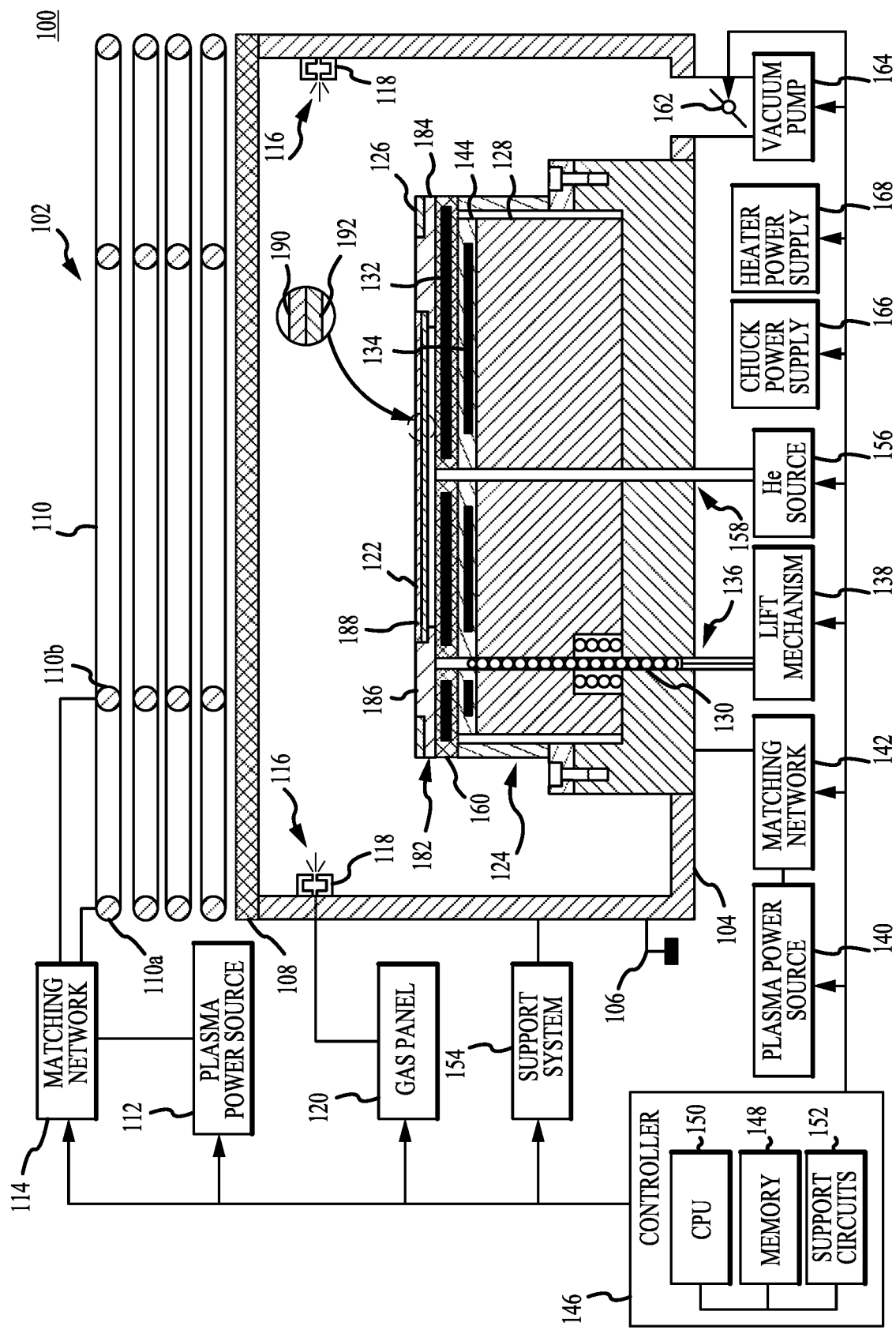
FIG. 1 shows a schematic cross-sectional view of an exemplary processing chamber according to some embodiments of the present technology.

Several of the figures are included as schematics. It is to be understood that the figures are for illustrative purposes, and are not to be considered of scale unless specifically stated to be of scale. Additionally, as schematics, the figures are provided to aid comprehension and may not include all aspects or information compared to realistic representations, and may include additional or exaggerated material for illustrative purposes.

In the appended figures, similar components and/or features may have the same reference label. Further, various components of the same type may be distinguished by following the reference label by a letter that distinguishes among the similar components. If only the first reference label is used in the specification, the description is applicable to any one of the similar components having the same first reference label irrespective of the letter.

DETAILED DESCRIPTION

When moving towards smaller technology nodes, such as the 7 nm node and smaller in semiconductor fabrication, improved techniques for patterning, such as extreme ultraviolet ("EUV") lithography may be used. EUV lithography utilizes a photomask structure that has been patterned with a specific integrated circuit design. The photomask is then incorporated in a lithography scanner, and used to pattern images on a substrate. EUV lithography utilizes a compound mask structure having multiple layers, including a mirror structure and an absorber. EUV technology may be characterized by several challenges, including mask 3D effects. Mask 3D effects involve the protrusion of the absorber from the mirror structure, which in operation may cause shadowing effects or imaging deviations on the substrate. These effects can cause placement shifts, and issues in focus between one-dimensional and two-dimensional features.

Although newer materials are being utilized and feature sizes are being adjusted in an attempt to resolve mask 3D effects, these changes cause new issues in terms of patterning. For example, many conventional technologies utilize ion-beam etching to pattern the absorber materials. Ion-beam etching essentially causes sputter removal of materials through a bombardment process with ions, such as from argon, or other inert materials. However, as the range of materials sought for incorporation in photomasks increases, materials characterized by different hardness values may be used in one or more layers of the mask structure. Consequently, hardmasks used in patterning may be challenged to resist bombardment as underlying materials being etched may be characterized by increased etch resistance. In effect, the increased power needed for etching the underlying materials cannot be compensated by thicker hardmasks, and critical dimension opening may occur. This can cause sloped absorber sidewalls, which may create critical dimension loss in the processing, where straight sidewalls are sought to improve mask operation.

The present technology overcomes these limitations by performing a selective etch process that may be tuned in situ to adjust etching operations between layers of the structure. By adjusting within chemical and multiple physical bombardment schemes, the present technology may improve selective removal as well as improve sidewall angle for absorber structures. Although the remaining disclosure will routinely identify specific materials and semiconductor structures utilizing the disclosed technology, it will be readily understood that the systems, methods, and materials are equally applicable to a number of other structures that may benefit from aspects of the present technology. Accordingly, the technology should not be considered to be so limited as for use with any specific processes or materials alone. Moreover, although an exemplary chamber is described to provide foundation for the present technology, it is to be understood that the present technology can be applied to virtually any semiconductor processing chamber that may allow the operations described.

FIG. 1 shows a schematic cross-sectional view of an exemplary processing chamber 100 according to some embodiments of the present technology. Processing chamber 100 may generally include a process chamber body 102 having a substrate support 124 or pedestal, and a controller 146. The chamber body 102 may have a conductive wall 104 that may support a substantially flat dielectric ceiling 108. Other embodiments of the processing chamber 100 may have other types of ceilings, such as a dome-shaped ceiling, or sloped ceiling. An antenna 110 may be disposed above the ceiling 108. The antenna 110 may include one or more inductive coil elements, such as co-axial elements 110a and 110b, which may be selectively controlled. The antenna 110 may be coupled through a first matching network 114 with a plasma power source 112. The plasma power source 112 may be capable of producing up to about 3000 W at a tunable frequency in a range from about 50 kHz to about 13.56 MHz.

The substrate pedestal 124 may be operated as a cathode in some embodiments, and may be coupled through a second matching network 142 with a biasing power source 140. The biasing source 140 may provide up to about 600 W at a tunable continuous wave, as well as a pulse frequency in the range of about 100 Hz to about 10 kHz. The biasing source 140 may produce pulsed RF power output, or the biasing source 140 may produce pulsed DC power output. As noted previously, source 140 may also provide a constant DC and/or RF power output. Substrate support 124 may include an electrostatic chuck 160. The electrostatic chuck 160 may include at least one clamping electrode 132 and may be controlled by a chuck power supply 166. In some embodiments, the substrate support 124 may include additional substrate retention mechanisms such as a susceptor clamp ring, a vacuum chuck, a mechanical chuck, or any other mechanical or other configuration to maintain a substrate in place during processing or etching operations.

A gas panel 120 may be coupled with the processing chamber 100 to provide process and/or other gases to the interior of the process chamber body 102. In some embodiments as illustrated, the gas panel 120 may be coupled with one or more inlets 116 formed in a channel 118 in the conductive wall 104 of the chamber body 102. The one or more inlets 116 may be provided in other locations as well, such as, for example, in the ceiling 108 of the processing chamber. The pressure in the processing chamber 100 may be controlled using a throttle valve 162 and a vacuum pump 164. The vacuum pump 164 and throttle valve 162 may be capable of maintaining chamber pressures in the range of about 1 mTorr to about 50 mTorr during processing operations. The temperature of the wall 104 may be controlled using liquid-containing conduits, which may run through the wall 104 in any number of continuous or segmented patterns. Wall temperature may be generally maintained at, above, or below room temperature. In some embodiments, the chamber wall 104 may be formed from a metal, such as or including aluminum, stainless steel, or other metals used in semiconductor processing chambers, and chamber wall 104 may be coupled with an electrical ground 106. The processing chamber 100 may also include a number of additional systems for process control, internal diagnostics, end point detection, or other operations that may facilitate semiconductor processing, and each of these systems are collectively shown as support systems 154.

A reticle adapter 182 may be used to secure a substrate, such as a reticle or other substrate 122, onto the substrate support 124. The reticle adapter 182 generally may include a lower portion 184 milled to cover an upper surface of the substrate support 124, such as the electrostatic chuck 160, for example, and a top portion 186 having an opening 188 that may be sized and shaped to hold the substrate 122. The opening 188 may be generally or substantially centered with respect to the substrate support 124. The adapter 182 may be generally formed from a single piece of etch resistant, high temperature resistant material such as polyimide ceramic or quartz. An edge ring 126 may cover and/or secure the adapter 182 to the pedestal 124 as shown. A lift mechanism 138 may be used to lower or raise the adapter 182, and hence, the substrate 122, onto or off of the substrate support 124. Generally, the lift mechanism 138 may be or include a plurality of lift pins, such as lift pin 130 shown, which may travel through respective guide holes 136.

In operation, the temperature of the substrate 122 may be controlled by stabilizing the temperature of the substrate support 124. In some embodiments, the substrate support 124 may include a heater 144 and/or an optional heat sink 128. The heater 144 may be one or more fluid conduits configured to receive and direct a heat transfer fluid through channel for maintaining temperature. Additionally, the heater 144 may be or include at least one heating element 134 that may be regulated by a heater power supply 168. A backside gas, such as helium or any other gas, from a gas source 156 may be provided via a gas conduit 158 to channels that may be formed in the pedestal surface under the substrate 122. The backside gas may be used to facilitate heat transfer between the substrate support 124 and the substrate 122. During processing, the substrate support 124 may be heated by the embedded heater 144 to a steady-state temperature, which in combination with the helium backside gas, may facilitate uniform heating of the substrate 122.

The controller 146 may include a central processing unit ("CPU") 150, a memory 148, and support circuits 152 for the CPU 150, which may facilitate control of the components of the processing chamber 100 and of an etch process, such as processes or operations discussed below in further detail. The controller 146 may be one of any form of general-purpose computer processor that can be used in an industrial setting for controlling various chambers and sub-processors. The memory 148 of the CPU 150 may be one or more of readily available memory such as random-access memory, read-only memory, floppy disk, hard disk, or any other form of digital storage, local or remote. The support circuits 152 may be coupled with the CPU 150 for supporting the processor in any number of ways as would be readily understood by the skilled artisan. The support circuits may include cache, power supplies, clock circuits, input/output circuitry and subsystems, as well as any other operational component. Processes or operations generally may be stored in the memory 148 or other computer-readable medium accessible to the CPU 150 as a software routine. Alternatively, a software routine may also be stored and/or executed by a second CPU that is remotely located from the hardware being controlled by the CPU 150.

Figure 2:
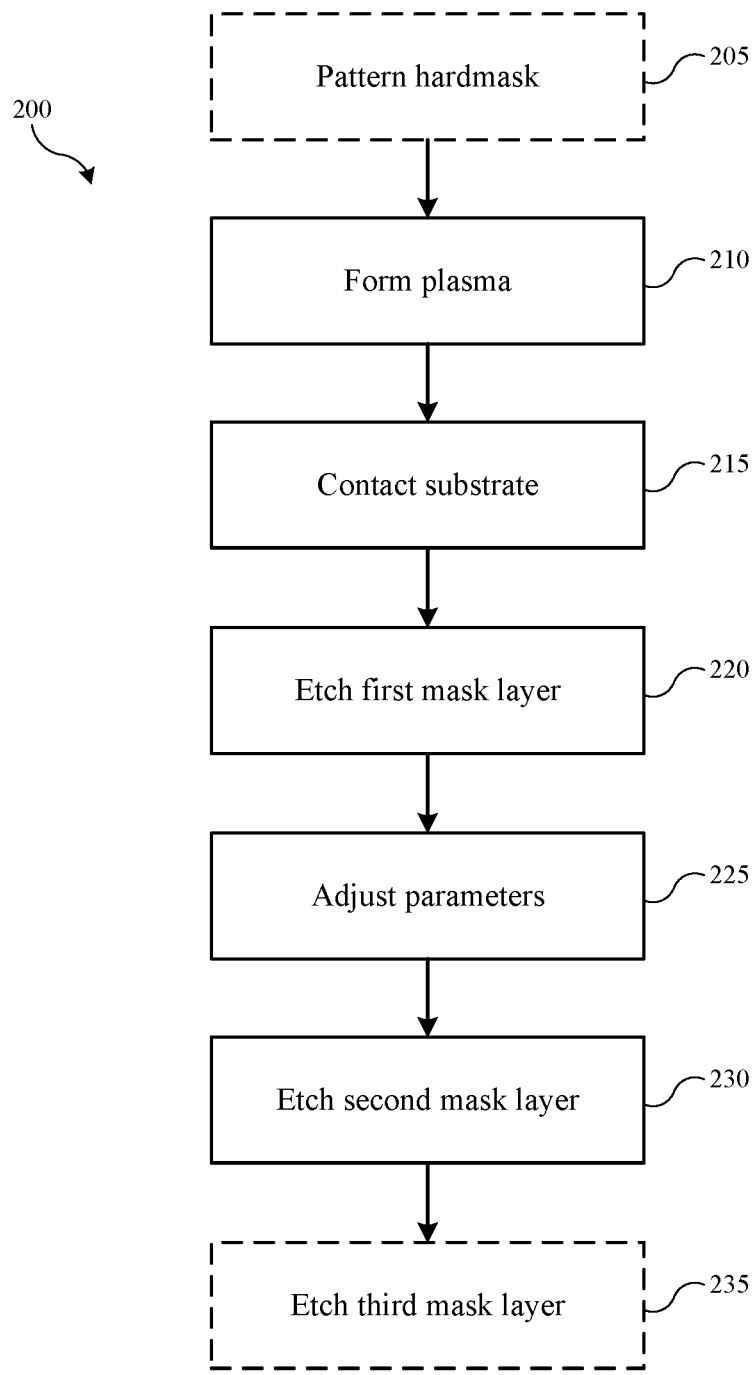
FIG. 2 shows exemplary operations in a method according to some embodiments of the present technology.

The chamber discussed previously may be used in performing exemplary methods, including etching methods. Turning to FIG. 2 is shown exemplary operations in a method 200 according to embodiments of the present technology. Method 200 may include one or more operations prior to the initiation of the method, including front end processing, deposition, etching, polishing, cleaning, or any other operations that may be performed prior to the described operations. The method may include a number of optional operations, which may or may not be specifically associated with some embodiments of methods according to embodiments of the present technology. For example, many of the operations are described in order to provide a broader scope of the processes performed, but are not critical to the technology, or may be performed by alternative methodology as will be discussed further below. Method 200 may describe operations shown schematically in FIGS. 3A-3E, the illustrations of which will be described in conjunction with the operations of method 200. It is to be understood that the figures illustrate only partial schematic views, and a substrate may contain any number of additional materials and features having a variety of characteristics and aspects as illustrated in the figures.

Figure 3A:
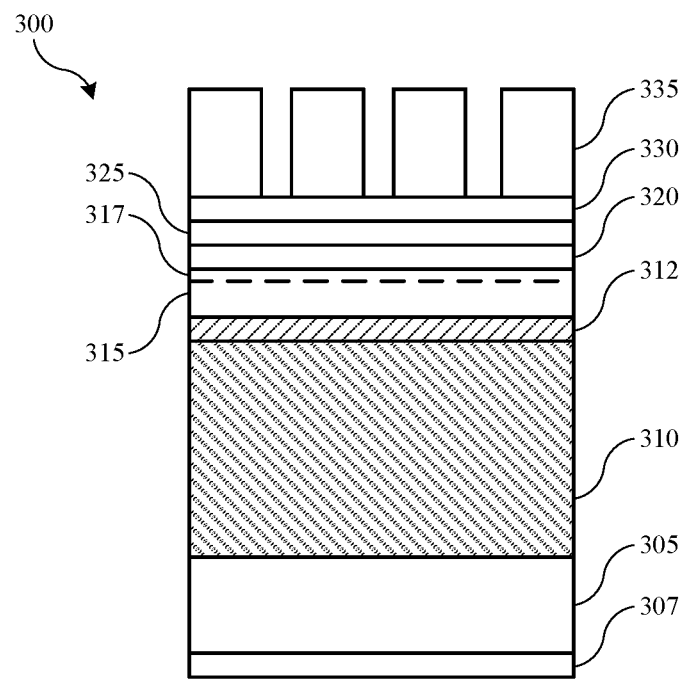
FIGS. 3A-3E show schematic cross-sectional views of materials etched according to some embodiments of the present technology.

Method 200 may or may not involve optional operations to develop the semiconductor structure to a particular fabrication operation. It is to be understood that method 200 may be performed on any number of semiconductor structures including photomask 300, as illustrated in FIG. 3A, which may be a photolithographic reticle or photomask as illustrated. For example, an exemplary photomask structure may include one or more layers that may be utilized or patterned. Exposed materials at any time during the etch process may be or include metal materials, one or more dielectric materials, alloy layers, hardmask materials, or any other materials that may be used in photomasks or other substrates. Although any number of photomasks or other semiconductor structures may be encompassed by the present technology, in some embodiments the photomask 300 may be an EUV photomask that may be patterned according to some embodiments of the present technology.

For example, FIG. 3A may illustrate a photomask structure that may be patterned to produce a reticle for photolithography. Although the remaining disclosure will reference the EUV mask structure illustrated, it is to be understood that the materials may include any number of alternatives as will be explained in accordance with embodiments of the present technology, and the processes described may involve etching of one or more layers of the structure, which may be formed from any number of materials. It is to be understood that the noted structure is not intended to be limiting, and any of a variety of other semiconductor structures including alternative photomask structures as well as any number of semiconductor layers incorporating materials described are similarly encompassed.

The present technology may include operations for etching one or more layers including an absorber of an EUV photomask structure. As illustrated, the photomask structure may include a number of layers formed sequentially to produce the structure, and some of the layers may be etched to produce the photomask. As shown, photomask 300, which may be a photomask structure, may include a quartz or low-thermal-expansion material substrate 305, which may form a base for the overlying structures. The substrate 305 may include a conductive backside coating 307 formed on a backside of the substrate, and which may be or include one or more transition-metal-containing materials, such as chromium, tantalum, or some other material, and which may include an oxide or nitride of any of these materials. Overlying the substrate 305 may be a mirror layer 310, which may be a set of layers of alternating materials to produce a Bragg reflector. In embodiments of the present technology, the mirror layer may be or include any number of materials typically used in photomasks, and in one non-limiting example, the mirror layer may include alternating layers of molybdenum and silicon in any number of pairs, such as forty, again as a non-limiting example.

Overlying the mirror layer may be a capping layer 312, which may protect the mirror layer from contact by etchants during processing. The capping layer may be or include any metal, including any transition metal, such as ruthenium as one example, any may include both a metal layer and a buffer layer overlying the metal layer in some embodiments. An absorber layer 315 may be disposed overlying the capping layer 312, and may be etched during embodiments of the present technology. The absorber may be characterized by reduced thickness to limit mask 3D effects, and in some embodiments the absorber may be characterized by a thickness of less than or about 50 nm, less than or about 40 nm, less than or about 30 nm, or less. In some embodiments the absorber layer may include more than one layer of material, including a second layer 317, as illustrated and delineated by the hatched line as shown. In some embodiments the absorber may have a consistent metal in each layer, such as a specific transition metal, as well as one or more non-metal materials, although in some embodiments including absorbers having multiple layers, the layers may include different metals including different transition metals.

Figure 3B:
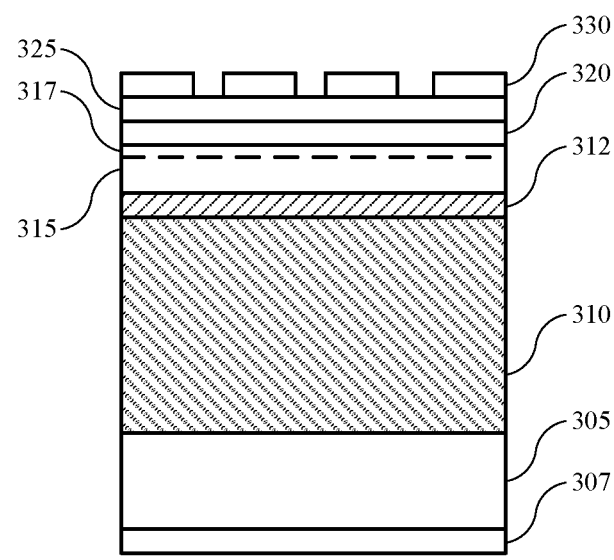

An anti-reflective coating layer 320 may be formed overlying the absorber layer, and in some embodiments an additional metal layer 325 may optionally be formed overlying the anti-reflective coating layer 320. At the top of the mask, a hardmask 330 may be formed followed by a resist 335, which may be patterned by a previous photolithography operation. Method 200 may include optionally patterning the hardmask utilizing the photoresist in some embodiments at optional operation 205, which may produce a patterned hardmask 330 overlying the photomask structure as illustrated in FIG. 3B.

As explained previously, conventional ion-beam etching may have difficulty patterning through the photomask layers between the hardmask 330 and the capping layer 312 while maintaining the feature critical dimensions. Additionally, in order to meet the requirements of future nodes, many mask layer materials may include a number of additional metals, metal oxides, metal nitrides, or other metal-containing materials. While ion-beam etching may have been capable of etching through one or two tantalum layers while maintaining feature or pitch width at feature sizes of dozens of nanometers or more, ion-beam etching has shown to be incapable of etching through advanced absorber and photomask materials without causing excessive gain in pitch width, or damage to one or more layers. For example, newer materials may include combinations of more etch resistant and less etch resistant materials throughout the stack of layers, which as illustrated may include two, three, four, or more layers of material. By more and less etch resistant may be meant both physically more resistant to etch, such as by having a greater hardness, as well as chemically more resistant to etch processes. Because ion-beam etching is limited to a high-energy sputtering etch process, less etch resistant materials may be substantially over etched as the process attempts to penetrate more etch resistant materials. This may cause extensive loss of profile maintenance of the anisotropic etch, which may impact absorber performance, if not cause device yield losses. Additionally, as the number of material layers increases, ion-beam etching may be incapable of selectively controlling loss of the hardmask layer, requiring increased mask thickness, which may not be compatible with future nodes.

To overcome the inability to selectively etch multiple layers while maintaining dimensional stability, the present technology may perform a plasma etch that may be selectively tuned in situ to adjust to specific stack layers. Utilizing end-point detection within the processing chamber, as noted above, upon identification of subsequent layers of the stack, modifications in the etch may be made as needed to maintain the etch process. Although a number of examples will be discussed in relation to the methods performed, it is to be understood that the present technology may be performed with a number of variations to accommodate a number of different materials, as well as the relationship between materials of the stack to be processed. Accordingly, the examples noted are not intended to limit the technology, which is to be understood to encompass multiple material combinations as will be described further below.

Materials to be etched between the hardmask and the capping layer may include a number of layers and materials. For example, the layers may include one or more of a metal layer 325, an anti-reflective coating layer 320, and one or more layers of material for absorber 315 according to embodiments of the present technology. Exemplary materials may include one or more transition metals from any of a variety of groups. For example, any of the layers of material may include one or more metals, such as including alloys, as well as one or more non-metals. The layers may include any combination of metals and/or non-metals in embodiments of the present technology. Tantalum may be included in one or more of the layers, both as a tantalum-based alloy, for example, in the absorber layer, as well as being included as an oxide, nitride, carbide, boride, or combination of any of these, such as an oxynitride.

Additionally, the present technology may be applicable to advanced absorber materials, which may include additional transition metal materials as well as non-metals. For example, any layer of the absorber 315, anti-reflective coating layer 320, and metal layer 325 may include, as non-limiting examples, one or more of tantalum, ruthenium, cobalt, nickel, niobium, iridium, aluminum, chromium, molybdenum, tungsten, hafnium, rhenium, osmium, vanadium, titanium, platinum, tin, silver, zinc, gold, antimony, iron, silicon, and copper. The materials may be included as alloys, such as nickel-aluminum, ruthenium-tungsten, chromium-nickel, among any other metal-metal combination. The materials may also include one or more non-metals, such as zinc telluride, silicon oxide, silicon nitride, tantalum oxynitride, tantalum oxide, tantalum nitride, chromium oxynitride, tantalum borate, tin oxide, and any other metal and non-metal combination, as well as non-metal and non-metal combinations.

Because of the variation in advanced absorber materials, as well as hardmask and layers between the hardmask and absorber, a number of stack combinations may have alternating layers characterized by different hardness qualities, which may impact etching. As one non-limiting example, some embodiments may include a set of layers where one or more layers includes a metal characterized by a greater etch resistance than the hardmask layer. To accommodate etching of these structures, the present technology may provide in situ modulation of etching parameters, which may facilitate maintaining etch profiles while adjusting between the layers. Additionally, the present technology may perform a combination of physical and chemical etching, which may be further tuned to accommodate the various layering of advanced photomasks.

Figure 3C:
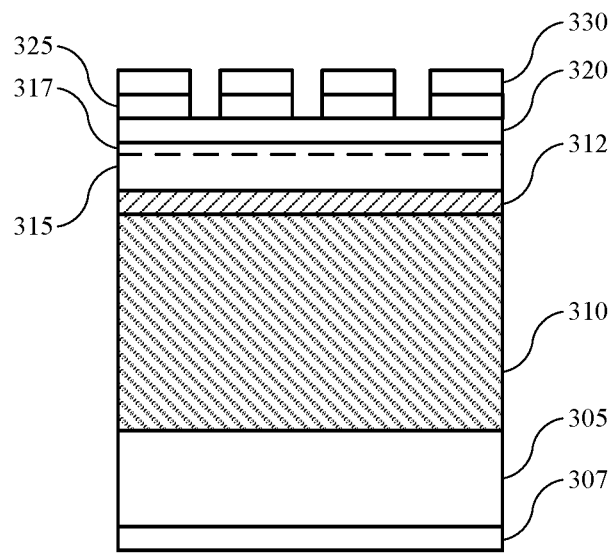

Regardless of the layering of materials, the present technology may perform a plasma etch, which may be tuned with one or more parameters to accommodate different layer characteristics. For example, in some embodiments, method 200 may include forming a plasma of a halogen-containing precursor at operation 210, which may produce plasma effluents. In some embodiments, the plasma may be characterized by a first source power, a first bias power, and a first bias frequency. At operation 215, the plasma effluents may contact the substrate or photomask, such as in a processing region of a semiconductor processing chamber as previously described. Through the mask material, the plasma effluents may etch a first layer of the mask at operation 220. The etching may be maintained until the pattern in the hardmask has been transferred through the first mask layer, which may expose a second layer of the photomask. End-point detection may be employed as previously described to identify when the first layer of the mask has been fully etched, and/or when the second layer of the mask has been exposed. The identification may occur in the processing chamber during the etching of the first layer, as well as while etching any subsequent layer as described below. As illustrated in FIG. 3C, the hardmask pattern may be applied through the first layer, and in some embodiments, the hardmask may be substantially maintained during the transfer or etching process. Although as illustrated, the first layer may be the metal layer 325, it is to be understood that in some embodiments the first layer may be an anti-reflective coating layer, such as layer 320, or the first layer may be one of the layers of an absorber material according to some embodiments of the present technology.

Figure 3D:
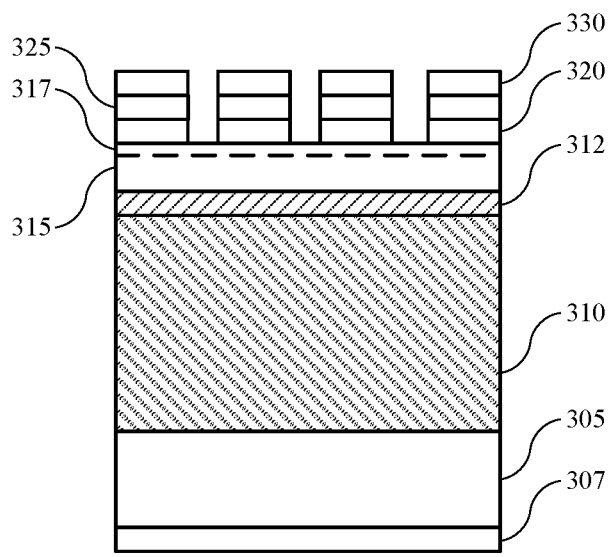

At operation 225, while the substrate may remain in the processing chamber, one or more parameters of the plasma etching may be performed. In some embodiments the parameters may be adjusted while the plasma is maintained to provide an adjustment in the etch process, although in some embodiments the plasma may be halted and subsequently ignited subsequent the adjustment. As will be described further below, the adjustments may include one or more operations, including adjusting the first bias frequency to a second bias frequency, adjusting the pressure within the processing chamber, and/or adjusting a flow rate ratio of one or more precursors used in the etch process. Subsequent the adjustment, the etching process may continue, and a second layer of the photomask may be etched in operation 230. As shown in FIG. 3D, the etch may continue in the same chamber, and anti-reflective coating layer 320 may be etched, although as noted above, the second layer may also be a layer of the absorber in some embodiments.

Figure 3E:
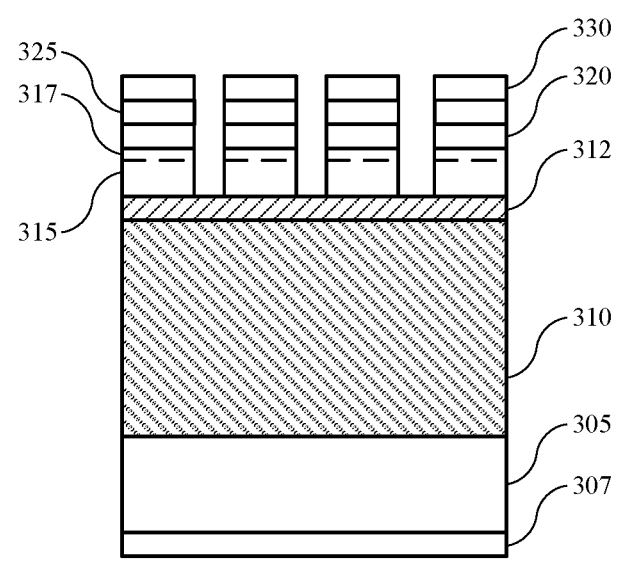

Method 200 may include one or more adjustments in the plasma or processing parameters, and may continue to etch a third layer at optional operation 235. The plasma or processing conditions may be the same or different than while etching the second layer, and may include multiple adjustments as previously described. Additionally, method 200 may include etching additional layers in order to continue proceeding through the stack of layers until the capping layer is exposed. As illustrated in FIG. 3E, the process may continue through any number of layers, including multiple absorber layers, until the capping layer or a buffer layer over the capping layer has been exposed. Accordingly, in some embodiments, etch parameters may be modified in situ, and layer-to-layer, as the etch process proceeds through the stack of materials until each layer between a hardmask and the capping layer has been etched. Although FIG. 3E illustrates the hardmask remaining, in some embodiments the hardmask may remain partially or may be removed during the etch process. Unlike with an ion-beam etching process, the present technology may allow a profile to be substantially or essentially maintained layer to layer despite differences in material characteristics between the layers.

The etch process may afford the noted etch benefits by utilizing precursors and process parameters that facilitate protecting exposed layers of material during each etch operation, and may accommodate material characteristics in each layer. For example, if the hardmask material includes a harder or more etch resistant metal, such as osmium, ruthenium, tungsten, iridium, or hafnium, for example, and the underlying layers include less etch resistant metals, including characterized by a lower hardness, such as chromium, titanium, or niobium, then a more reactive bombardment etch may be performed which may penetrate each layer while maintaining the hardmask. Additionally, when different layers include different material characteristics, a number of parameters may be adjusted. Unlike ion-beam etching, which may be essentially limited to physical removal, the present technology may utilize both physical and chemical etching, where both the physical and chemical etching characteristics may be adjusted in situ and between material layers. Accordingly, material differences may be accommodated to ensure a profile is maintained and that materials are sufficiently etched during the process.

As one non-limiting example, each of the capping layer 312 and the metal layer 325, when included, may include ruthenium, or a ruthenium-containing material, which may be a physically harder material that may be more difficult to etch compared to less etch resistant materials metals. However, the anti-reflective coating layer and one or more of the absorber layers may be or include a less etch resistant metal, such as tantalum, for example, or may include a more etch resistant metal, such as iridium. Accordingly, plasma characteristics used to etch each layer may be modified to accommodate the film. Again, as a non-limiting example, where the anti-reflective coating layer includes tantalum, such as tantalum oxynitride, tantalum boron oxide, or some other material, while the absorber includes iridium, an iridium alloy, or a doped iridium, such as silicon-doped iridium, challenges may occur during the etching if plasma parameters are maintained consistent. For example, if a higher energy etch is performed throughout the stack, the more etch resistant iridium-containing layer may result in a slower etch, while the tantalum-containing layer may etch more readily. Because at least a portion of the anti-reflective coating layer may be exposed during the absorber etch, if plasma characteristics are maintained, critical dimension gain may occur in the anti-reflective coating layer, which may cause sloped sidewalls on the absorber, or incorrect dimensions, such as from over etch. The present technology may accommodate both conditions where an underlying film is both harder and softer, or more etch resistant and less etch resistant, than an overlying film by adjusting one or more aspects of physical and/or chemical etching.

For example, the processing chamber, such as processing chamber 100 previously described, may provide switchable bias frequency during etching between two or more bias frequencies, as well as utilizing multiple-frequency operation at either electrode. For example, one or more etching operations may be performed at a first bias frequency or a first combination frequency, while one or more additional etching operations may be performed at a second bias frequency or second combination frequency. Combination frequencies may also include ratios between two frequencies, such as, for one non-limiting example, 25% of a first frequency and 75% of a second frequency, although it is to be understood that the two frequencies may be any two percentages. The first bias frequency may include a higher frequency, such as greater than or about 10 MHz, and may be greater than or about 13.56 MHz, greater than or about 27 MHz, greater than or about 40 MHz, or more. The second bias frequency may include a lower frequency, such as less than or about 10 MHz, and may be less than or about 7 MHz, less than or about 5 MHz, less than or about 2 MHz, less than or about 1 MHz, less than or about 500 kHz, less than or about 400 kHz, or less. A combination frequency may include any second frequency as well. A first layer may be etched at either the higher frequency or the lower frequency, while an underlying layer may be etched at the other frequency, or vice versa. Accordingly, the first frequency may be either higher or lower than a second frequency during subsequent layer etching where the bias frequency is adjusted. Similarly, additional adjustments may be made when a subsequent layer, such as a third layer, is being etched, and a third bias frequency may be used. The third bias frequency may be the second bias frequency maintained, the third bias frequency may be a reversion to the first bias frequency, or in some embodiments a third bias frequency different from the first or second may be applied.

Changing the bias frequency or the combination ratio in situ may allow a concentration of ions and neutrals to be modified, which may impact the amount of physical etching that is performed. For example, at a bias frequency of 13.56 MHz, the plasma may be characterized by a lower ion energy, which may increase chemical etching, or control a sputtering component of the material layer. At a lower bias frequency, such as 2 MHz, for example, the plasma may be characterized by increased ion energy, which may increase bombardment, and which may facilitate etching more etch resistant films. Lower frequency may increase etch rate based on an increased ion energy, although the increased bombardment may further reduce overlying films. For example, if a hardmask layer includes an oxide, oxynitride, or nitride, or a less etch resistant material, such as titanium, chromium, or niobium, while an absorber layer includes ruthenium or iridium, reducing the frequency to facilitate etching of the more etch resistant underlying film may increase removal of the hardmask material. Accordingly, in such instances and other similar material disparities, additional processing aspects may be adjusted while maintaining the processing operations.

The precursors during each of the operations may include a first fluorine-containing precursor, and in some embodiments may include a second halogen-containing precursor, and may include a third precursor, which may or may not be a halogen-containing precursor. In some embodiments a chlorine-containing precursor, a bromine-containing precursor, an iodine-containing precursor or other halogen-containing precursor may be used as the second halogen-containing precursor, as well as another fluorine-containing precursor or combination of precursors. Exemplary halogen-containing precursors may include one or more of fluorine or chlorine in some embodiments, as well as any other halogen. Some exemplary precursors that may be utilized as the fluorine-containing precursor may include halides including hydrogen fluoride, nitrogen trifluoride, or any organofluoride, such as carbon tetrafluoride or other fluorocarbons, as well as hydrofluorocarbons such as fluoromethane, difluoromethane, or trifluoromethane. Precursors may include diatomic fluorine, bromine trifluoride, chlorine trifluoride, sulfur hexafluoride, xenon difluoride, boron trichloride, tungsten pentachloride, tungsten hexachloride, diatomic chlorine, or any other chlorine-containing or fluorine-containing precursor. The precursors may also be flown together in a variety of combinations as well as flow rate ratios. The precursors may also be flowed with any number of additional precursors or carrier gases including diatomic hydrogen, or a hydrogen-containing precursor, nitrogen, argon, helium, or any number of additional materials, although in some embodiments the precursors may be limited to control side reactions or other aspects that may impact selectivity.

In some embodiments, multiple fluorine-containing precursors may be used, and may include one or more polymerizing precursors, as well as one or more non-polymerizing precursors, which may or may not include a halogen, for example. For example, when a precursor includes carbon, or carbon and hydrogen, byproducts may form along sidewalls of the feature being produced. Exemplary precursors may include a halogen, such as carbon tetrafluoride, or may not, such as carbonyl sulfide, or any other carbon-containing or carbon-and-hydrogen-containing precursor. This may protect more readily etched materials, while more etch resistant materials are being etched with increased ion energy. As a non-limiting example, when the anti-reflective coating layer includes a more readily etched material than the absorber, if a bias frequency is simply reduced between the layer etching, the coating layer or even the hardmask may be further opened, which can impact dimensional stability of the etch processes. However, if an increased amount of a polymerizing precursor is utilized, the exposed sidewalls of the overlying layers may be protected as the more etch resistant underlying layer may be removed with a more physical etch.

To increase the polymerization, in some embodiments a parameter adjusted may be a flow rate ratio between a first fluorine-containing precursor, which may include carbon or carbon and hydrogen, and a second halogen-containing precursor, which may be free of both carbon and hydrogen, for example. The flow rate ratio may be greater than or about 1:1, and may be greater than or about 2:1, greater than or about 3:1, greater than or about 4:1, greater than or about 5:1, greater than or about 6:1, greater than or about 7:1, greater than or about 8:1, greater than or about 9:1, greater than or about 10:1, or more. Additionally, a third precursor may also be incorporated, which may have even higher polymerizing potential. For example, the first fluorine-containing precursor may include carbon, and the third precursor may include carbon and/or hydrogen. The third precursor may be included at any of the ratios noted above in relation to either the first fluorine-containing precursor or the second halogen-containing precursor, with any of the precursors being in the higher ratio. Similarly, when successive layers may be more readily etched relative to an overlying layer, a ratio of the second halogen-containing precursor may be increased relative to the first fluorine-containing precursor up to any of the ratios noted above, and/or delivery of the third precursor may be halted, which may limit polymerization. This may increase an etch rate through the layers, which may further increase selectivity of removal between the layers. The flow rate ratio may be modified between any two layers, which may impact etch rate and selectivity of the etch in embodiments of the present technology.

Other processing conditions may impact and facilitate etching according to embodiments of the present technology. For example, the temperature at which the operations are performed may impact the extent to which the reaction may occur. Increased temperature may increase etching of some materials, such as less etch resistant materials, and temperature may be controlled to limit or increase etching of these materials. As one non-limiting example, in some embodiments the hardmask material may be or include a more temperature sensitive material, such as including chromium or silicon, which may be more readily removed at higher temperature. Accordingly, the etch process may be performed at temperatures below about 100° C., for example, throughout the etch process, which may protect the hardmask from over etching. Additionally, the temperature may be increased where the mask material may be less likely to be removed, where underlying films may be more readily etched at higher temperatures. Hence, in embodiments the processing temperature may be maintained between about 20° C., or lower, and about 150° C., or higher, during the processing. The temperature may be adjusted between operations in some embodiments as well, and the temperature may also be maintained at any temperature within these ranges, within smaller ranges encompassed by these ranges, or between any of these ranges.

The pressure within the chamber may also affect the operations performed. By maintaining a lower pressure during one or more etching operations, such as during etching of a film characterized by more etch resistant materials, increased interaction at the substrate surface may be facilitated. The lower pressure may increase the mean-free path between atoms, which may increase energy and interaction at the film surface. Similarly, by utilizing a higher pressure during some operations, such as when more readily sputtered films may be exposed, etch rate may be reduced, while allowing increased chemical interaction between the etchant and the material to be removed. Accordingly, in some embodiments the pressure may be maintained at any pressure between about 0.5 mTorr and about 50 mTorr for any operation during the method. The pressure may be adjusted between operations in some embodiments as well, and the pressure may also be maintained at any pressure within these ranges, within smaller ranges encompassed by these ranges, or between any of these ranges.

The power of the source and/or bias may be controlled, which may allow increased control over the depth of etching operations, and effects on layers exposed during etching operations. Accordingly, during any operation, plasma power may be maintained at less than about 500 W at either or both of the source and bias. By maintaining a lower plasma power, sputtering may be controlled, and interactions may be limited to superficial chemical reactions, which may better limit the extent of etching through the materials. Consequently, in some embodiments the plasma power for either or both of the source and the bias may be maintained at less than or about 450 W, less than or about 400 W, less than or about 350 W, less than or about 300 W, less than or about 250 W, less than or about 200 W, less than or about 150 W, less than or about 100 W, or less.

In some embodiments the source and/or bias power may be pulsed at any of the frequencies noted previously, which may allow for an amount of "off" time of certain aspects of the processing. This may allow chemical interactions to be maintained, or may allow time for deposition of polymer byproducts, which may protect materials to be maintained. Accordingly, the bias power may be pulsed during any operation during methods according to embodiments of the present technology. When pulsing, the power may be applied at a higher level than any of the power values noted above, although the effective power may be maintained at 500 W or below through pulsing. By adjusting plasma and/or processing parameters during etching operations, the present technology may be used to etch through multiple layers of material in sequence, without increasing downtime or substrate transfer between chambers. Additionally, the processing may increase profile control during etching, which may allow absorbers characterized by any of the materials previously noted to be characterized by sidewall angles of greater than or about 80°, and which may be characterized by sidewall angles of greater than or about 82°, greater than or about 84°, greater than or about 85°, greater than or about 86°, greater than or about 87°, greater than or about 88°, greater than or about 88.5°, greater than or about 89.0°, greater than or about 89.5°, or substantially or essentially 90°, within measuring tolerances, which may improve operation as a photomask absorber.

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the embodiments. Additionally, a number of well-known processes and elements have not been described in order to avoid unnecessarily obscuring the present technology. Accordingly, the above description should not be taken as limiting the scope of the technology. Additionally, methods or processes may be described as sequential or in steps, but it is to be understood that the operations may be performed concurrently, or in different orders than listed.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either, neither, or both limits are included in the smaller ranges is also encompassed within the technology, subject to any specifically excluded limit in the stated range. Where the stated range includes one or both of the limits, ranges excluding either or both of those included limits are also included.

As used herein and in the appended claims, the singular forms "a", "an", and "the" include plural references unless the context clearly dictates otherwise. Thus, for example, reference to "a precursor" includes a plurality of such precursors, and reference to "the layer" includes reference to one or more layers and equivalents thereof known to those skilled in the art, and so forth.

Also, the words "comprise(s)", "comprising", "contain(s)", "containing", "include(s)", and "including", when used in this specification and in the following claims, are intended to specify the presence of stated features, integers, components, or operations, but they do not preclude the presence or addition of one or more other features, integers, components, operations, acts, or groups.

The invention claimed is:

1. An etching method comprising:
    forming a plasma of a fluorine-containing precursor to produce plasma effluents, wherein a first bias frequency is applied while forming the plasma;
    contacting a substrate housed in a processing region of a semiconductor processing chamber with the plasma effluents, wherein the substrate comprises a photomask;
    etching a first layer of the photomask, wherein etching the first layer of the photomask exposes a second layer of the photomask;
    adjusting the first bias frequency to a second bias frequency while maintaining the plasma of the fluorine-containing precursor; and
    etching the second layer of the photomask.

2. The etching method of claim 1, wherein the photomask comprises:
    a mirror layer;
    an absorber overlying a mirror layer; and
    a capping layer disposed between the absorber and the mirror layer, wherein the capping layer comprises a metal.

3. The etching method of claim 2, wherein the photomask further comprises:
    a hardmask overlying the absorber; and
    an anti-reflective coating layer disposed between the hardmask and the absorber, and wherein at least one of the hardmask and the anti-reflective coating layer comprises an oxide or a nitride material.

4. The etching method of claim 3, wherein the photomask further comprises:
    a layer of material disposed between the hardmask and the anti-reflective coating layer, wherein the layer of material comprises a metal.

5. The etching method of claim 1, wherein the fluorine-containing precursor comprises:
    a first fluorine-containing precursor; and
    a second halogen-containing precursor, wherein the first fluorine-containing precursor comprises carbon, and wherein the second halogen-containing precursor is free of carbon.

6. The etching method of claim 5, wherein a flow rate ratio of the first fluorine-containing precursor to the second halogen-containing precursor is greater than or about 2:1.

7. The etching method of claim 5, further comprising:
    subsequent etching the first layer of the photomask, adjusting a flow rate ratio of the first fluorine-containing precursor and the second halogen-containing precursor.

8. The etching method of claim 5, wherein the fluorine-containing precursor further comprises:
    a third precursor, wherein the third precursor comprises carbon.

9. The etching method of claim 8, wherein the third precursor is utilized during only one of etching the first layer of the photomask or etching the second layer of the photomask.

10. The etching method claim 1, wherein a chamber pressure within the semiconductor processing chamber is maintained at less than or about 50 mTorr.

11. The etching method claim 1, wherein etching the second layer of the photomask exposes a third layer of the photomask, the method further comprising:
    adjusting the second bias frequency to a third bias frequency while maintaining the plasma of the fluorine-containing precursor.

12. An etching method comprising:
    forming a plasma of a first fluorine-containing precursor and a second halogen-containing precursor to produce plasma effluents, wherein a first bias frequency is applied while forming the plasma;
    contacting a substrate housed in a processing region of a semiconductor processing chamber with the plasma effluents, wherein the substrate comprises a photomask, and wherein the photomask comprises at least three layers between a hardmask and a mirror layer of the photomask;
    etching a first layer of the photomask, wherein etching the first layer of the photomask exposes a second layer of the photomask;
    adjusting at least one of:
        the first bias frequency to a second bias frequency,
        a pressure within the semiconductor processing chamber,
        an effective power of a source and/or a bias electrode, or
        a flow rate ratio between the first fluorine-containing precursor and the second halogen-containing precursor; and
    etching the second layer of the photomask.

13. The etching method of claim 12, further comprising:
    detecting exposure of the second layer of the photomask while etching the first layer of the photomask.

14. The etching method of claim 12, wherein the photomask comprises:
a mirror layer;
an absorber overlying a mirror layer; and
a capping layer disposed between the absorber and the mirror layer, wherein the capping layer comprises a metal.

15. The etching method of claim 14, wherein the absorber comprises at least two layers of material.

16. The etching method of claim 12, wherein etching the second layer of the photomask exposes a third layer of the photomask, the method further comprising:
etching the third layer of the photomask, wherein a bias frequency is maintained between either etching the first layer of the photomask and the second layer of the photomask, or etching the second layer of the photomask and etching the third layer of the photomask.

17. The etching method of claim 12, wherein at least one of the three layers comprises a first metal, and wherein the hardmask comprises a second metal characterized by a hardness less than a hardness of the first metal.

18. The etching method of claim 12, wherein the plasma is further formed of a third precursor, wherein the first fluorine-containing precursor comprises carbon, wherein the second halogen-containing precursor is free of carbon, and wherein the third precursor comprises carbon.

19. An etching method comprising:
forming a plasma of at least one fluorine-containing precursor to produce plasma effluents, wherein a first bias frequency is applied while forming the plasma;
contacting a substrate housed in a processing region of a semiconductor processing chamber with the plasma effluents, wherein the substrate comprises a photomask, and wherein the photomask comprises at least two layers between a hardmask and a mirror layer of the photomask;
etching a first layer of the photomask, wherein etching the first layer of the photomask exposes a second layer of the photomask;
adjusting the first bias frequency to a second bias frequency, wherein the first bias frequency is greater than or about 10 MHz, and wherein the second bias frequency is less than or about 10 MHz; and
etching the second layer of the photomask.

20. The etching method of claim 19, wherein the photomask comprises:
a mirror layer;
an absorber overlying a mirror layer; and
a capping layer disposed between the absorber and the mirror layer, wherein the capping layer comprises a metal.

* * * * *